US012743140B2

(12) United States Patent
An et al.

(10) Patent No.: US 12,743,140 B2
(45) Date of Patent: Sep. 22, 2026

(54) SMART POWER MANAGEMENT METHOD FOR POWER CONSUMPTION REDUCTION BASED ON INTELLIGENT BMC

(71) Applicant: Korea Electronics Technology Institute, Seongnam-si (KR)

(72) Inventors: Jae Hoon An, Incheon (KR); Young Hwan Kim, Yongin-si (KR)

(73) Assignee: Korea Electronics Technology Institute, Seongnam-si (KR)

( * ) Notice: Subject to any disclaimer, the term of this patent is extended or adjusted under 35 U.S.C. 154(b) by 371 days.

(21) Appl. No.: 18/387,910

(22) Filed: Nov. 8, 2023

(65) Prior Publication Data

US 2024/0160261 A1 May 16, 2024

(30) Foreign Application Priority Data

Nov. 11, 2022 (KR) ........................ 10-2022-0150618

(51) Int. Cl.
*G06F 1/20* (2006.01)
*G06F 1/3234* (2019.01)
*H05K 7/20* (2006.01)

(52) U.S. Cl.
CPC .............. *G06F 1/206* (2013.01); *G06F 1/325* (2013.01); *H05K 7/20727* (2013.01); *H05K 7/20836* (2013.01)

(58) Field of Classification Search
CPC ..... G06F 1/206; G06F 1/325; H05K 7/20727; H05K 7/20836; H05K 7/20209
See application file for complete search history.

(56) References Cited

U.S. PATENT DOCUMENTS

2005/0128700 A1* 6/2005 Alperin .................. G06F 1/206
713/324
2007/0047199 A1* 3/2007 Tsutsui .................... G06F 1/203
361/679.48

(Continued)

FOREIGN PATENT DOCUMENTS

JP 2015-162098 A 9/2015
KR 10-2003-0027839 A 4/2003
KR 10-2004-0100541 A 12/2004

OTHER PUBLICATIONS

Korean Office Action issued on Apr. 22, 2024, in counterpart Korean Patent Application No. 10-2022-0150618 (5 pages in English, 7 pages in Korean).

*Primary Examiner* — Ziaul Karim
*Assistant Examiner* — Vincent W Chang
(74) *Attorney, Agent, or Firm* — NSIP Law

(57) ABSTRACT

There is provided a smart power management method for power consumption reduction based on an intelligent BMC. A cooling fan control method by a BMC according to an embodiment includes: collecting monitoring data regarding computing modules; calculating a current CPU power from the collected monitoring data; predicting a future CPU temperature from the collected monitoring data; setting a rotation speed of a cooling fan based on the calculated current CPU power and the predicted future CPU temperature; and controlling the cooling fan at the set rotation speed. Accordingly, the BMC controls a cooling fan effectively/efficiently by interworking with on-device AI, thereby reducing power consumption in a server.

15 Claims, 3 Drawing Sheets

(56) References Cited

U.S. PATENT DOCUMENTS

| | | | | |
|---|---|---|---|---|
| 2011/0046812 | A1* | 2/2011 | Hansen | G06F 1/206 700/300 |
| 2015/0245540 | A1* | 8/2015 | Ogawa | H05K 7/20836 361/679.48 |
| 2018/0039552 | A1 | 2/2018 | Moskowiz et al. | |
| 2019/0361508 | A1* | 11/2019 | Yarragunta | G05D 23/1931 |
| 2021/0325947 | A1* | 10/2021 | Shabbir | G06F 1/206 |
| 2022/0075433 | A1* | 3/2022 | Matsushita | H05K 7/20136 |
| 2022/0156171 | A1* | 5/2022 | Lee | G06N 3/044 |

* cited by examiner

SMART POWER MANAGEMENT METHOD FOR POWER CONSUMPTION REDUCTION BASED ON INTELLIGENT BMC

CROSS-REFERENCE TO RELATED APPLICATION(S) AND CLAIM OF PRIORITY

This application is based on and claims priority under 35 U.S.C. § 119 to Korean Patent Application No. 10-2022-0150618, filed on Nov. 11, 2022, in the Korean Intellectual Property Office, the disclosure of which is herein incorporated by reference in its entirety.

BACKGROUND

Field

The disclosure relates to a baseboard management controller (BMC), and more particularly, to an intelligent BMC which controls a cooling fan by interworking with on-device artificial intelligence (AI).

Description of Related Art

A BMC is a controller that is mounted in a server or a normal computer to provide an interface for managing a system between system management software and a hardware platform, and operates on an intelligent platform management interface (IPMI), intelligent platform management bus (IPMB)-based software architect through the interface.

Recently, the BMC may be used for managing not only a server, a storage, network equipment but also a data center infrastructure.

The BMC is used as a means for controlling a cooling fan of a server since it is a controller appropriate for system management, but there is a limitation to effective power consumption reduction in controlling a cooling fan since the BMC is poor in terms of advanced computing power.

SUMMARY

The disclosure has been developed in order to solve the above-described problems, and an object of the disclosure is to provide an intelligent BMC which controls a cooling fan effectively/efficiently by interworking on-device AI, as a solution for reducing power consumption in a server.

According to an embodiment of the disclosure to achieve the above-described object, a cooling fan control method may include: collecting monitoring data regarding computing modules; calculating a current CPU power from the collected monitoring data; predicting a future CPU temperature from the collected monitoring data; setting a rotation speed of a cooling fan based on the calculated current CPU power and the predicted future CPU temperature; and controlling the cooling fan at the set rotation speed.

Predicting may include predicting a future CPU temperature by using an AI model that is trained to predict a future CPU temperature by analyzing collected monitoring data.

The AI model may be trained by an external platform and may be driven in a secondary service processor (SSP) which is distinguished from a primary service processor (PSP) of a BMC.

Setting may include, when the future CPU temperature exceeds a set maximum temperature, giving an optimal rotation speed that is obtained when the future CPU temperature is a maximum temperature as a rotation speed of the cooling fan.

Setting may include, when the future CPU temperature is less than or equal to the set maximum temperature, setting a rotation speed of the cooling fan based on the current CPU power.

Setting may include, when the current CPU power is less than or equal to a threshold power, giving a minimum rotation speed as a rotation speed of the cooling fan.

Setting may include, when the current CPU power exceeds the threshold power, setting a rotation speed of the cooling fan based on a result of comparing the future CPU temperature and a threshold temperature.

Setting may include, when the CPU temperature is less than or equal to the threshold temperature, giving a minimum rotation speed as a rotation speed of the cooling fan.

Setting may include, when the future CPU temperature exceeds the threshold temperature, giving an optimal rotation speed corresponding to the future CPU temperature as a rotation speed of the cooling fan.

According to another embodiment of the disclosure, a cooling fan control system may include: a monitoring engine configured to collect monitoring data regarding computing modules; a prediction module configured to predict a future CPU temperature from the collected monitoring data; a fan control engine configured to calculate a current CPU power from the collected monitoring data, and to set a rotation speed of a cooling fan based on the calculated current CPU power and the predicted future CPU temperature; and a handler configured to control the cooling fan at the set rotation speed.

According to still another embodiment of the disclosure, a cooling fan control method may include: calculating a current CPU power from monitoring data regarding computing modules; setting a rotation speed of a cooling fan based on a future CPU temperature predicted from collected monitoring data and the current CPU power; and controlling the cooling fan at the set rotation speed.

According to yet another embodiment of the disclosure, a cooling fan control system may include: a control engine configured to calculate a current CPU power from monitoring data regarding computing modules, and to set a rotation speed of a cooling fan based on a future CPU temperature predicted from collected monitoring data and the current CPU power; and a handler configured to control the cooling fan at the set rotation speed.

According to embodiments of the disclosure as described above, a BMC may control a cooling fan effectively/efficiently by interworking with on-device AI, thereby reducing power consumption in a server.

Other aspects, advantages, and salient features of the invention will become apparent to those skilled in the art from the following detailed description, which, taken in conjunction with the annexed drawings, discloses exemplary embodiments of the invention.

Before undertaking the DETAILED DESCRIPTION OF THE INVENTION below, it may be advantageous to set forth definitions of certain words and phrases used throughout this patent document: the terms “include” and “comprise,” as well as derivatives thereof, mean inclusion without limitation; the term “or,” is inclusive, meaning and/or; the phrases “associated with” and “associated therewith,” as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like. Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts.

DETAILED DESCRIPTION

Hereinafter, the disclosure will be described in more detail with reference to the accompanying drawings.

Embodiments of the disclosure propose an intelligent BMC which reduces power consumption of a server by interworking with on-device AI and a smart cooling fan control algorithm.

Figure 1:
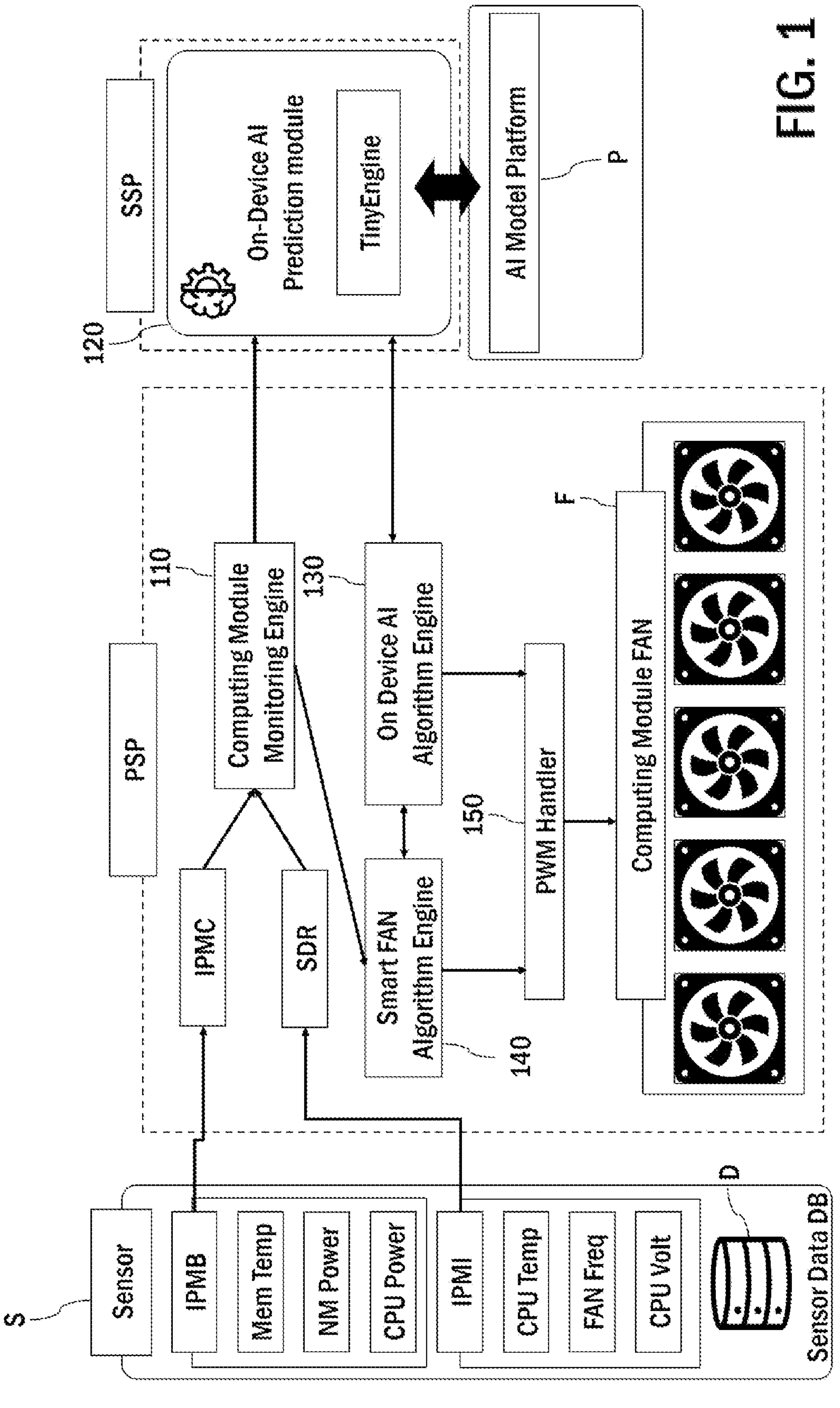
FIG. 1 is view illustrating a configuration of an intelligent BMC according to an embodiment of the disclosure.

FIG. 1 is a view illustrating a configuration of an intelligent BMC according to an embodiment of the disclosure. As shown in FIG. 1, the intelligent BMC may include a computing monitoring engine 110, an on-device AI prediction module 120, an on-device AI algorithm engine 130, a smart fan algorithm engine 140, and a pulse width modulation (PWM) handler 150.

The computing module monitoring engine 110 may collect monitoring information regarding computing modules installed on a main board through sensors S. Communication between the computing module monitoring engine 110 and the sensors S may be performed through an intelligent platform management (IPM) controller (IPMC), a sensor data recorder (SDR) which is a protocol such as an IPMI, an IPMB.

The collected monitoring information may include information regarding various states of a server, such as a temperature, humidity, a power mode, in addition to state information of the computing modules. Primary state information in an embodiment of the disclosure is information regarding power and temperature of a CPU. The monitoring information may be stored in a sensor data DB D.

The monitoring data collected by the computing module monitoring engine 110 may be provided to the on-device AI prediction module 120 and the smart fan algorithm engine 140.

The on-device AI prediction module 120 may predict a future CPU temperature from the monitoring data by using an AI model. The AI model is an AI model that is trained to predict a future CPU temperature by analyzing monitoring data. In predicting a future CPU temperature, data related to a fan rotation speed, CPU power may further be referred to in addition to temperature data of the CPU.

The AI model may be trained by an AI model platform P, and the on-device AI prediction module 120 may receive trained AI model data from the AI model platform P, and may construct an AI model and may predict a future CPU temperature.

The on-device AI prediction module 120 may be implemented in a secondary service processor (SSP) which is distinguished from a primary service processor (PSP) of the intelligent BMC, and may operate an AI model with a tiny engine.

The on-device AI algorithm engine 130 may control rotation speeds of cooling fans F through the PWM handler 150, based on the future CPU temperature predicted by the on-device AI prediction module 120.

The smart fan algorithm engine 140 may control rotation speeds of the cooling fans F by interworking with the on-device AI prediction module 120. Specifically, the smart fan algorithm engine 140 may identify a CPU power based on monitoring data collected by the computing module monitoring engine 110, and may control rotation speeds of the cooling fans F based on the identified CPU power and the future CPU temperature predicted by the on-device AI prediction module 120.

Figure 2:
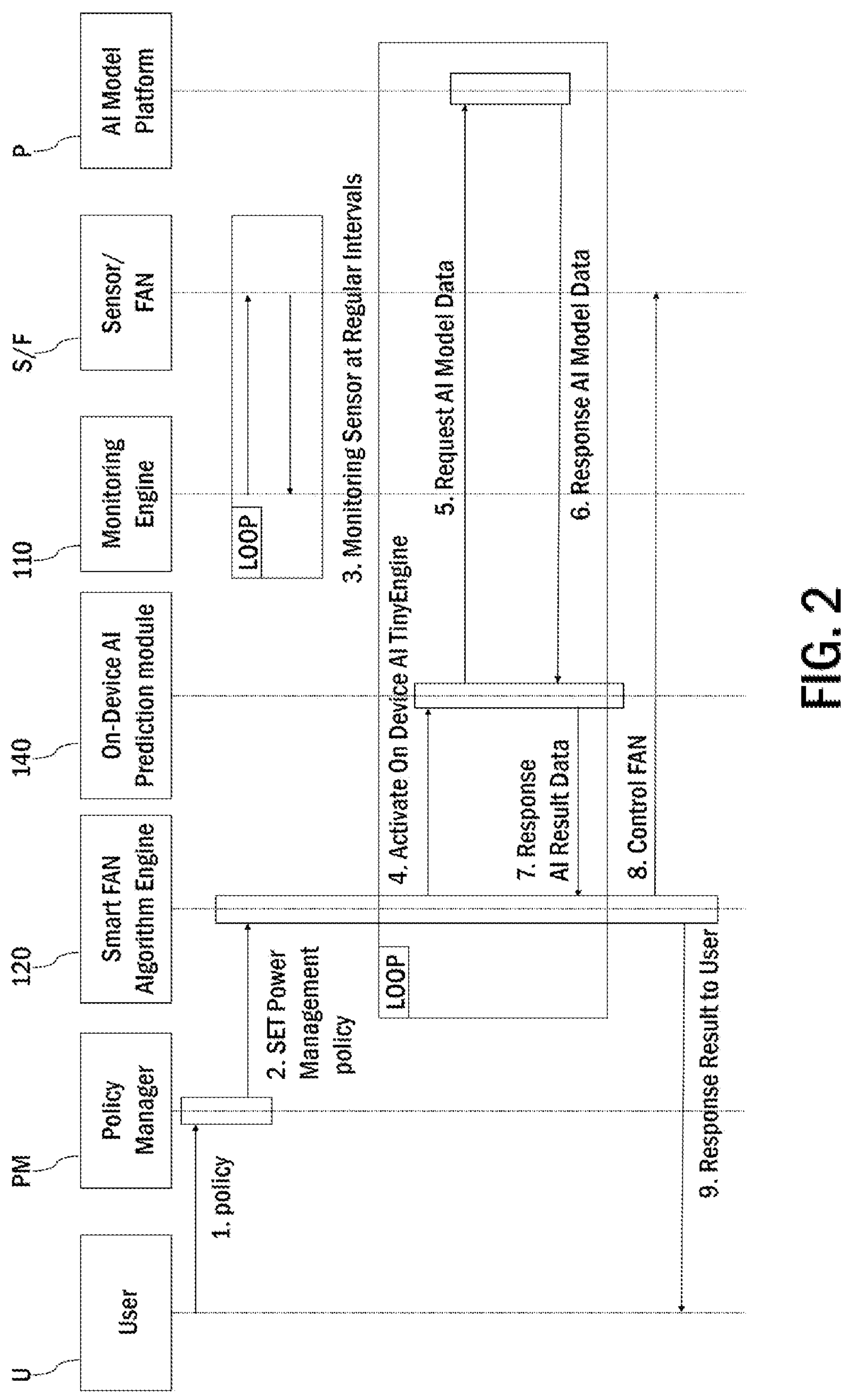
FIG. 2 is a sequence diagram provided to explain a cooling fan control method according to another embodiment of the disclosure.

A process in which the smart fan algorithm engine 140 and the on-device AI prediction module 120 control rotation speeds of the cooling fans F by interworking with each other will be described in detail with reference to FIG. 2. FIG. 2 is a sequence diagram provided to explain a cooling fan control method according to another embodiment.

As shown in FIG. 2, when a user U inputs a power management policy (1), a policy manager (PM) may set a power management mode according to the power management policy inputted by the user U (2).

The computing module monitoring engine 110 may periodically collect monitoring information regarding computing modules installed on a main board and an environment through sensors S (3).

The smart fan algorithm engine 140 may request the on-device AI prediction module 120 to predict a future CPU temperature through the on-device AI algorithm engine (not shown) (4).

Then, the on-device AI prediction module 120 may request AI model data for predicting a future CPU temperature from the AI model platform P (5), and the AI model platform P may provide corresponding AI model data to the on-device AI prediction module 120 (6).

Thereafter, the on-device AI prediction module 120 may construct an AI model from the AI model data provided from the AI model platform P, and may predict a future CPU temperature from monitoring data and may return a result of predicting to the smart fan algorithm engine 140 (7).

Then, the smart fan algorithm engine 140 may calculate rotation speeds of the cooling fans F based on the future CPU temperature predicted by the on-device AI prediction module 120, and may control rotation speeds of the cooling fans F through the PWM handler (not shown) (8).

Finally, the smart fan algorithm engine 140 may notify the user U of a result of controlling.

Figure 3:
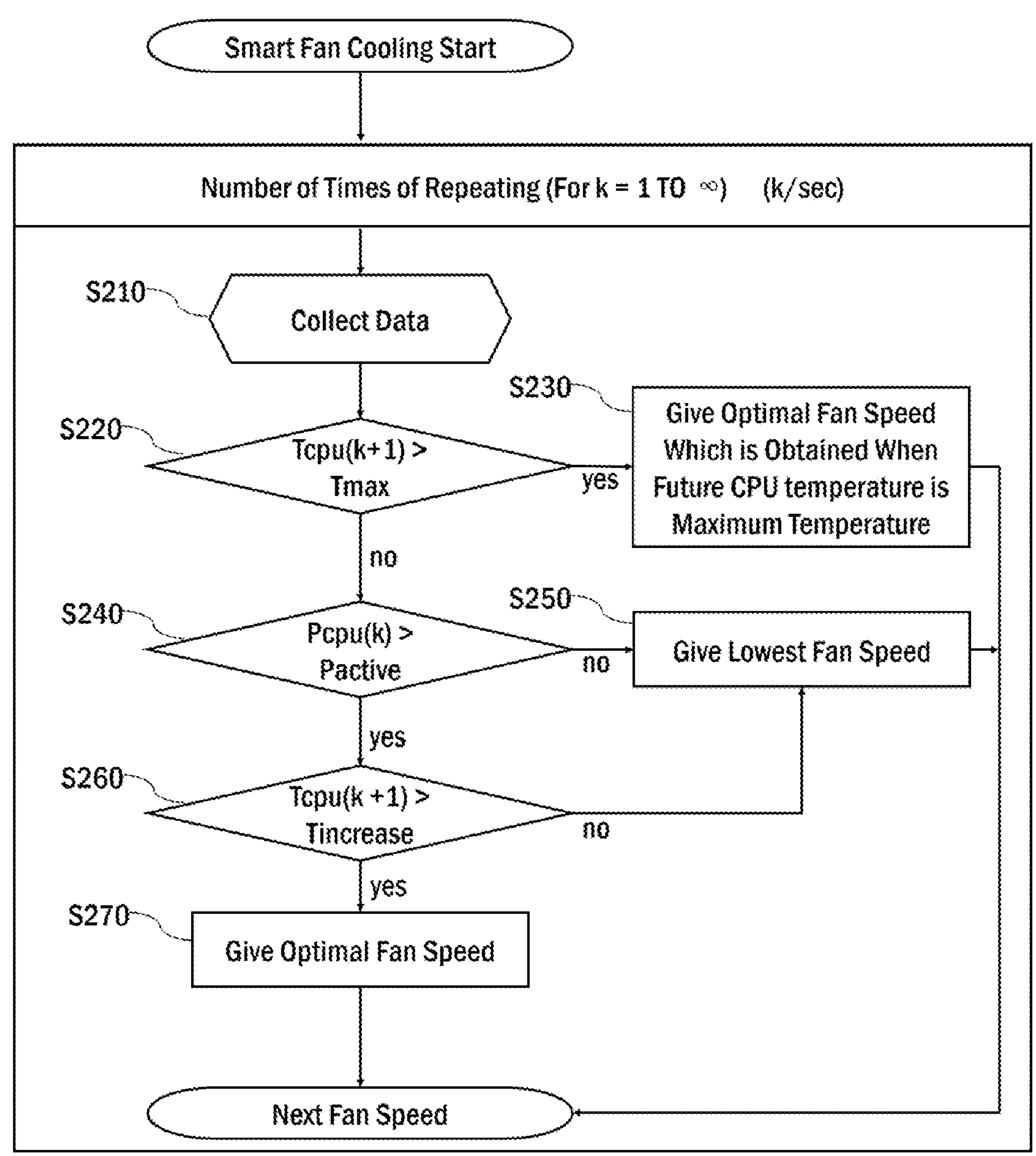
FIG. 3 is a flowchart provided to explain a cooling fan rotation speed calculation method.

Hereinafter, a method for the smart fan algorithm engine 140 to calculate rotation speeds of the cooling fans F based on a current CPU power and a future CPU temperature will be described in detail with reference to FIG. 3. FIG. 3 is a flowchart provided to explain a cooling fan rotation speed calculation method.

As shown in FIG. 3, the smart fan algorithm engine 140 may calculate current CPU power data from monitoring data collected by the computing module monitoring engine 110, and may acquire future CPU temperature data from the on-device AI prediction module 120.

When the future CPU temperature [Tcpu(K+1)] exceeds a set maximum temperature (Tmax) (S220—Yes), the smart fan algorithm engine 140 may give an optimal rotation speed that is obtained when future CPU temperature [Tcpu (K+1)] is the maximum temperature (Tmax) as rotation speeds of the cooling fans F (S230).

On the other hand, when the future CPU temperature [Tcpu(K+1)] is less than or equal to the set maximum temperature (Tmax) (S220—No), the smart fan algorithm engine 140 may compare a current CPU power [Pcpu(K)] and a set threshold power Pactive (S240).

When the current CPU power [Pcpu(K)] is less than or equal to the threshold power Pactive as a result of comparing (S240—No), the smart fan algorithm engine 140 may give a lowest rotation speed as rotation speeds of the cooling fans F (S250).

On the other hand, when the current CPU power [Pcpu (K)] exceeds the threshold power Pactive as a result of comparing (S240—Yes), the smart fan algorithm engine 140 may compare the future CPU temperature [Tcpu(K+1)] and a threshold temperature Tincrease (S260).

When the future CPU temperature [Tcpu(K+1)] is less than or equal to the threshold temperature Tincrease as a result of comparing (S260—No), the smart fan algorithm engine 140 may give a lowest rotation speed as rotation speeds of the cooling fans F (S250).

On the other hand, when the future CPU temperature [Tcpu(K+1)] exceeds the threshold temperature Tincrease as a result of comparing (S270—Yes), the smart fan algorithm engine 140 may give an optimal rotation speed according to the future CPU temperature [T(K+1)] as rotation speeds of the cooling fans F (S270).

Herein, the maximum temperature Tmax, the threshold temperature Tincrease, and the threshold power Pactive may be set by the user's policy described above.

Up to now, an intelligent BMC which reduces power consumption of a server by controlling rotation speeds of cooling fans by interworking with on-device AI and a smart cooling fan control algorithm has been described in detail with reference to preferred embodiments.

In the above-described embodiments, the smart fan algorithm engine 140 refers to a future CPU temperature predicted by the on-device AI prediction module 120 in controlling cooling fans. However, the smart fan algorithm engine 140 may directly predict a future CPU temperature from monitoring data and may use the future CPU temperature.

For example, it is possible to predict a future CPU temperature based on an input temperature, an output temperature, a heat coefficient, a previous temperature of a server.

The technical concept of the present disclosure may be applied to a computer-readable recording medium which records a computer program for performing the functions of the apparatus and the method according to the present embodiments. In addition, the technical idea according to various embodiments of the present disclosure may be implemented in the form of a computer readable code recorded on the computer-readable recording medium. The computer-readable recording medium may be any data storage device that can be read by a computer and can store data. For example, the computer-readable recording medium may be a read only memory (ROM), a random access memory (RAM), a CD-ROM, a magnetic tape, a floppy disk, an optical disk, a hard disk drive, or the like. A computer readable code or program that is stored in the computer readable recording medium may be transmitted via a network connected between computers.

In addition, while preferred embodiments of the present disclosure have been illustrated and described, the present disclosure is not limited to the above-described specific embodiments. Various changes can be made by a person skilled in the at without departing from the scope of the present disclosure claimed in claims, and also, changed embodiments should not be understood as being separate from the technical idea or prospect of the present disclosure.

What is claimed is:

1. A cooling fan control method comprising:

collecting monitoring data regarding computing modules;

calculating a current CPU power from the collected monitoring data;

predicting a future CPU temperature from the collected monitoring data by using an artificial intelligence (AI) model that is trained to predict the future CPU temperature by analyzing the collected monitoring data, wherein the predicting comprises requesting trained AI model data from an external AI model platform, receiving the trained AI model data from the external AI model platform, and constructing the AI model from the received trained AI model data, and wherein the AI model is trained by the external AI model platform and is driven in a secondary service processor (SSP) which is distinguished from a primary service processor (PSP) of a baseboard management controller (BMC);

setting a rotation speed of a cooling fan based on the calculated current CPU power and the predicted future CPU temperature; and controlling the cooling fan at the set rotation speed.

2. The cooling fan control method of claim 1, wherein setting comprises, when the future CPU temperature exceeds a set maximum temperature, giving an optimal rotation speed that is obtained when the future CPU temperature is a maximum temperature as a rotation speed of the cooling fan.

3. The cooling fan control method of claim 2, wherein setting comprises, when the future CPU temperature is less than or equal to the set maximum temperature, setting a rotation speed of the cooling fan based on the current CPU power.

4. The cooling fan control method of claim 3, wherein setting comprises, when the current CPU power is less than or equal to a threshold power, giving a minimum rotation speed as a rotation speed of the cooling fan.

5. The cooling fan control method of claim 4, wherein setting comprises, when the current CPU power exceeds the threshold power, setting a rotation speed of the cooling fan based on a result of comparing the future CPU temperature and a threshold temperature.

6. The cooling fan control method of claim 5, wherein setting comprises, when the future CPU temperature is less than or equal to the threshold temperature, giving a minimum rotation speed as a rotation speed of the cooling fan.

7. The cooling fan control method of claim 6, wherein setting comprises, when the future CPU temperature exceeds the threshold temperature, giving an optimal rotation speed corresponding to the future CPU temperature as a rotation speed of the cooling fan.

8. A cooling fan control system comprising:

one or more processors configured to:

collect monitoring data regarding computing modules;

predict a future CPU temperature from the collected monitoring data by using an artificial intelligence (AI)

model that is trained to predict the future CPU temperature by analyzing the collected monitoring data, wherein the predicting comprises requesting trained AI model data from an external AI model platform, receiving the trained AI model data from the external AI model platform, and constructing the AI model from the received trained AI model data, and wherein the AI model is trained by the external AI model platform and is driven in a secondary service processor (SSP) which is distinguished from a primary service processor (PSP) of a baseboard management controller (BMC);

calculate a current CPU power from the collected monitoring data, and to set a rotation speed of a cooling fan based on the calculated current CPU power and the predicted future CPU temperature; and control the cooling fan at the set rotation speed.

9. The cooling fan control system of claim 8, wherein, for the setting, the one or more processors are configured to, when the future CPU temperature exceeds a set maximum temperature, give an optimal rotation speed that is obtained when the future CPU temperature is a maximum temperature as a rotation speed of the cooling fan.

10. The cooling fan control system of claim 9, wherein, for the setting, the one or more processors are configured to, when the future CPU temperature is less than or equal to the set maximum temperature, set a rotation speed of the cooling fan based on the current CPU power.

11. The cooling fan control system of claim 10, wherein, for the setting, the one or more processors are configured to, when the current CPU power is less than or equal to a threshold power, give a minimum rotation speed as a rotation speed of the cooling fan.

12. The cooling fan control system of claim 11, wherein, for the setting, the one or more processors are configured to, when the current CPU power exceeds the threshold power, set a rotation speed of the cooling fan based on a result of comparing the future CPU temperature and a threshold temperature.

13. The cooling fan control system of claim 12, wherein, for the setting, the one or more processors are configured to, when the future CPU temperature is less than or equal to the threshold temperature, give a minimum rotation speed as a rotation speed of the cooling fan.

14. The cooling fan control system of claim 13, wherein for the setting, the one or more processors are configured to, when the future CPU temperature exceeds the threshold temperature, give an optimal rotation speed corresponding to the future CPU temperature as a rotation speed of the cooling fan.

15. A cooling fan control method comprising:

calculating a current CPU power from monitoring data regarding computing modules;

predicting a future CPU temperature from collected monitoring data by using an artificial intelligence (AI) model that is trained to predict the future CPU temperature by analyzing the collected monitoring data, wherein the predicting comprises requesting trained AI model data from an external AI model platform, receiving the trained AI model data from the external AI model platform, and constructing the AI model from the received trained AI model data, and wherein the AI model is trained by the external AI model platform and is driven in a secondary service processor (SSP) which is distinguished from a primary service processor (PSP) of a baseboard management controller (BMC);

setting a rotation speed of a cooling fan based on the future CPU temperature predicted from the collected monitoring data and the current CPU power; and controlling the cooling fan at the set rotation speed.

* * * * *